United States Patent [19]
Bryant

[11] Patent Number: 5,250,456
[45] Date of Patent: Oct. 5, 1993

[54] METHOD OF FORMING AN INTEGRATED CIRCUIT CAPACITOR DIELECTRIC AND A CAPACITOR FORMED THEREBY

[75] Inventor: Frank R. Bryant, Denton, Tex.

[73] Assignee: SGS-Thomson Microelectronics, Inc., Carrollton, Tex.

[21] Appl. No.: 759,465

[22] Filed: Sep. 13, 1991

[51] Int. Cl.$^5$ .................... H01L 21/70; H01L 21/265
[52] U.S. Cl. ........................................ 437/47; 437/52; 437/60; 437/241
[58] Field of Search ...................... 437/47, 52, 60, 919, 437/24, 241, 24, 47; 357/51, 23.6

[56] References Cited

U.S. PATENT DOCUMENTS

| | | | |
|---|---|---|---|
| 4,621,277 | 11/1986 | Ito et al. | 357/54 |
| 4,623,912 | 11/1986 | Chang et al. | 357/54 |
| 4,774,197 | 9/1988 | Haddad et al. | 437/27 |
| 4,806,498 | 2/1989 | Fujii | 437/24 |
| 4,818,711 | 4/1989 | Choksi et al. | 437/24 |
| 4,882,649 | 11/1989 | Chen et al. | 361/313 |
| 4,897,368 | 1/1990 | Kobushi et al. | 437/200 |

FOREIGN PATENT DOCUMENTS

| | | | |
|---|---|---|---|
| 1-298758 | 12/1989 | Japan | 437/919 |
| 2-106959 | 4/1990 | Japan | 437/52 |

OTHER PUBLICATIONS

Josquin, et al., "The Oxidation Inhibition in Nitrogen-Implanted Silicon", *J. Electrochem. Soc.: Solid-State Science and Technology* (Aug. 1962) pp. 1803-1810.

*Primary Examiner*—Robert Kunemund
*Assistant Examiner*—Loc Q. Trinh
*Attorney, Agent, or Firm*—Rodney M. Anderson; Lisa K. Jorgenson; Richard K. Robinson

[57] ABSTRACT

A method of forming a capacitor in an integrated circuit, such as a dynamic random access memory (DRAM), and a capacitor and DRAM cell formed by such a method, is disclosed. A first capacitor plate is formed of silicon, for example polysilicon, followed by oxidation thereof to form a thin capacitor oxide layer thereover; alternatively, the thin capacitor oxide layer may be deposited. Nitrogen ions are then implanted through the oxide and into the silicon. A high temperature anneal is then performed in a nitrogen atmosphere, which causes the implanted nitrogen to accumulate near the interface between the silicon first plate and the oxide layer, forming a nitride-like region thereat. An optional sealing thermal reaction (oxidation or nitridation) may then be performed, to reduce the effects of pinholes or other defects in the composite film. The second plate may then be formed of polysilicon, metal, or a metal silicide, completing the capacitor.

17 Claims, 4 Drawing Sheets

METHOD OF FORMING AN INTEGRATED CIRCUIT CAPACITOR DIELECTRIC AND A CAPACITOR FORMED THEREBY

This invention is in the field of integrated circuits, and is more specifically directed to methods of forming dielectric films for capacitors such as are used in dynamic memory cells.

BACKGROUND OF THE INVENTION

A continuing trend in the field of electronic integrated circuits is to increase the density of circuit functions per semiconductor unit area, which reduces the cost and increases the performance and functionality of the integrated circuits. As is fundamental in this field, this increased density is obtained through reduction of the physical feature size of the circuit elements. A conventionally measured feature size in metal-oxide-semiconductor (MOS) integrated circuits is the minimum transistor gate width, or transistor channel length, with MOS transistors having channel lengths of less than one micron now commercially available.

For many manufacturers, dynamic random access memories (DRAMs) are the circuits which have the highest density and smallest feature size. This is due to the relatively high production rates and significant cost pressures for DRAMs, and also because much of the chip surface area of a DRAM is occupied by simple repetitive elements, namely one-transistor, one-capacitor memory cells.

However, the capacitance of a DRAM cell cannot be scaled at the same rate at which the other circuit feature sizes are scaled, beyond a certain point. This limitation is the well-known "soft error" mechanism by which DRAM cells lose data when impacted by alpha particles generated from cosmic rays, packaging material, and other sources. The soft error rate from alpha particles increases dramatically for DRAM cells that store less than about $2.5 \times 10^{-13}$ coulombs of charge (approximately 50 fF at 5 volts). Since capacitance decreases with decreasing capacitor plate area, scaling the feature size of a DRAM cell, with constant capacitor dielectric and thickness, reduces the cell capacitance.

One way to maintain a constant capacitance with deceasing feature sizes is to reduce the dielectric thickness. Where silicon dioxide is the dielectric material, however, capacitor dielectrics thinner than about 10 nm are difficult to fabricate with acceptable manufacturing yield, as these films are particularly susceptible to pinholes and other point defects. Furthermore, ultrathin silicon dioxide films may not be able to withstand full power supply voltages placed thereacross; since the charge stored is equal to capacitance times voltage, a reduction in the applied voltage requires a further increase in the capacitance in order to store the same charge, exacerbating the problem.

Various techniques have been used to scale the size of DRAM devices while still maintaining sufficient capacitance and low soft error rates. For example, DRAMs are now available which have their cell capacitors located in trenches, taking advantage of the vertical dimension to provide larger capacitors occupying relatively little chip surface area.

Another common technique is to increase the dielectric constant of the capacitor dielectric from that of pure silicon dioxide, increasing the capacitance per unit area while decreasing the vulnerability of the film to defects. This can be accomplished by the use of composite, or multi-layer, capacitor dielectrics, such as films having both silicon nitride and silicon dioxide. Common configurations of these films include nitride-oxide (NO) and oxide-nitride-oxide (ONO) films. These composite films offer the yield advantage of relatively thick and reliable dielectrics while still providing high capacitance, due to the higher effective dielectric constant provided by silicon nitride.

A conventional method of forming NO and ONO films includes the deposition of silicon nitride over the silicon lower capacitor plate (in the case of the ONO film, over a thin thermal oxide layer), followed by the oxidation of an upper portion of the silicon nitride to form silicon dioxide (i.e., oxidized silicon nitride). The oxidized silicon nitride serves to "seal" (or repair) any pinholes in the deposited silicon nitride.

U.S. Pat. No. 4,623,912, issued Nov. 18, 1986, discloses a method of fabricating an oxide/nitride film by first thermally oxidizing silicon to form thermal silicon dioxide, followed by thermal nitridation of the silicon dioxide to form a silicon oxynitride film. The nitrogen concentration in this silicon oxynitride film has a decreasing concentration at depths away from the upper surface, so that the lower portion of the film is substantially silicon dioxide.

U.S. Pat. No. 4,621,277, issued Nov. 4, 1986, discloses a method of forming a nitride/oxide/nitride film using thermal processing. According to one disclosed embodiment, a silicon nitride film is first formed by the direct thermal nitridation of the underlying silicon. This silicon nitride film is then thermally oxidized to form thermal silicon dioxide at an upper portion; a portion of the thermal silicon dioxide is then thermally converted to a nitride. The resultant film is thus a composite film including varying amounts of oxide and nitride.

U.S. Pat. No. 4,882,649 discloses another method of forming a nitride/oxide/nitride film, in which a layer of silicon nitride is deposited over the underlying silicon. A layer of silicon dioxide is then either deposited over, or formed by thermal oxidation of a portion of, the first nitride layer. A layer of silicon nitride is then deposited over the silicon dioxide layer, completing the nitride/oxide/nitride film.

Each of these methods form the composite films by successive processing steps, either thermal reaction or deposition, thus building the film layer-by-layer. The processing flow for these films is thus relatively complex, requiring either that the wafers be moved between processing steps or alternatively requiring the use of relatively complex processing equipment capable of performing multiple processes in-situ. Particularly in the case where the wafers are transported after the formation of each layer, contamination of the surface of a layer can occur, resulting in increased charge trapping and other causes of failure at the interfaces between the layers of the film.

By way of further background, Josquin et al., "The Oxidation Inhibition in Nitrogen-Implanted Silicon", *J. Electrochem. Soc.: SOLID-STATE SCIENCE AND TECHNOLOGY* (August, 1982), pp. 1803–1810, describes the mechanism of oxidation inhibition in nitrogen-implanted silicon. As described in this article, an experiment was performed by which <100> single-crystal silicon with an overlying silicon dioxide layer (either native oxide of a thickness on the order of 2 nm, or a fabricated layer of a thickness on the order of 70 to 100 nm) was implanted with nitrogen ions. In particular, $^{15}N_2^+$ was implanted at a dose of $10^{16}/cm^2$ at an energy of 50 keV. This article further discloses that, after a one hour post-implant anneal at 1000° C. in $N_2$ atmosphere, the implanted nitrogen accumulates at the silicon-silicon dioxide interface (see FIGS. 3 and 7), creating a nitride-like layer thereat.

By way of further background, it is known to form single-crystal silicon-on-insulator (SOI) films by implanting oxygen ions and thereafter thermally treating the structure so that the implanted oxygen reacts with the silicon atoms thereat. In this conventional technique, commonly referred to as "SIMOX", the energy of the oxygen implant is selected so that a layer of silicon dioxide is formed at a certain depth into the body, so that a single-crystal layer of silicon remains over the oxide.

It is an object of the present invention to provide a method of forming a composite dielectric film including an oxide layer overlying a nitride layer, where the interface between the layers is not exposed during processing.

It is a further object of this invention to provide a method for forming such a film with reduced process complexity.

It is a further object of this invention to provide such a method where the nitride layer is in contact with the underlying silicon plate.

It is a further object of this invention to provide a capacitor, such as useful in a DRAM memory cell, formed according to such a method.

Other objects and advantages of the invention will be apparent to those of ordinary skill in the art having reference to the following specification together with the drawings.

SUMMARY OF THE INVENTION

The invention may be incorporated into a method for forming an integrated circuit capacitor, such as is useful in a dynamic random access memory (DRAM) cell, which has a composite dielectric film including layers of silicon nitride and silicon dioxide. A thin layer of silicon dioxide is formed over the lower silicon plate of the capacitor by thermal oxidation, or alternatively by chemical vapor deposition. Nitrogen ions are then implanted into the structure with sufficient energy to reach the lower silicon plate. An anneal is then performed, which causes the implanted nitrogen to accumulate near the silicon-oxide surface to form a nitride-like layer thereat. As a result, an underlying nitride layer is formed between the silicon lower plate and the silicon dioxide layer without exposure of the interface between the nitride and oxide. Thermal oxidation or nitridation of the overlying oxide layer may then be performed, if desired, to repair pinholes and other void-type defects in the oxide. The capacitor is then completed by formation of the upper capacitor plate thereover.

DETAILED DESCRIPTION OF THE PREFERRED EMBODIMENTS

Figure 1:
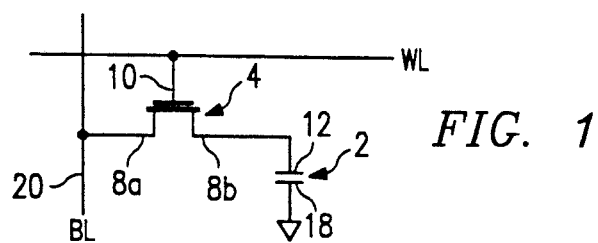
FIG. 1 is an electrical diagram, in schematic form, of a conventional memory cell which may be formed according to the present invention.

Referring to FIG. 1, the electrical configuration and operation of a conventional dynamic random access memory (DRAM) cell of the one-transistor, one-capacitor type will be briefly described, as the benefits of the present invention are especially important for such devices. Certain of the reference numerals in FIG. 1 indicate the location of various of the physical elements in the preferred embodiment of FIGS. 2 and 3, as will be described hereinbelow. The DRAM cell of FIG. 1 includes a storage capacitor 2 which has plate 18 connected to a fixed voltage, for example ground, and which has its other plate 12 connected to source/drain 8b of metal-oxide-semiconductor (MOS) pass transistor 4. As is fundamental in this art, storage capacitor 2 is in either a charged or discharged state, depending upon the value of the data to be stored therein. The fixed voltage to which plate 18 of capacitor 2 is biased may be ground as in this example, or at the voltage of a power supply or at another reference voltage, as is well known in the art. Pass transistor 4 also has source/drain region 8a connected to bit line BL (20), and its gate 10 connected to word line WL.

In operation, as is well known, word line WL will be driven bY a row decoder (not shown) to a voltage sufficient to turn on pass transistor 4 when its row is selected. With pass transistor 4 on, plate 12 of capacitor 2 is effectively connected to bit line BL, so that the charge stored thereupon will be placed onto bit line BL for sensing by a sense amplifier in the conventional manner. During either a write operation or the restore portion of the conventional DRAM cycle, the voltage to which bit line BL is driven (i.e. the desired data state) determines whether capacitor 2 is to be charged or discharged. Once capacitor 2 is set, word line WL returns to a voltage sufficient to turn off pass transistor 4, isolating plate 12 of capacitor 2 from bit line BL so that the charged or discharged state is maintained.

Figure 2:
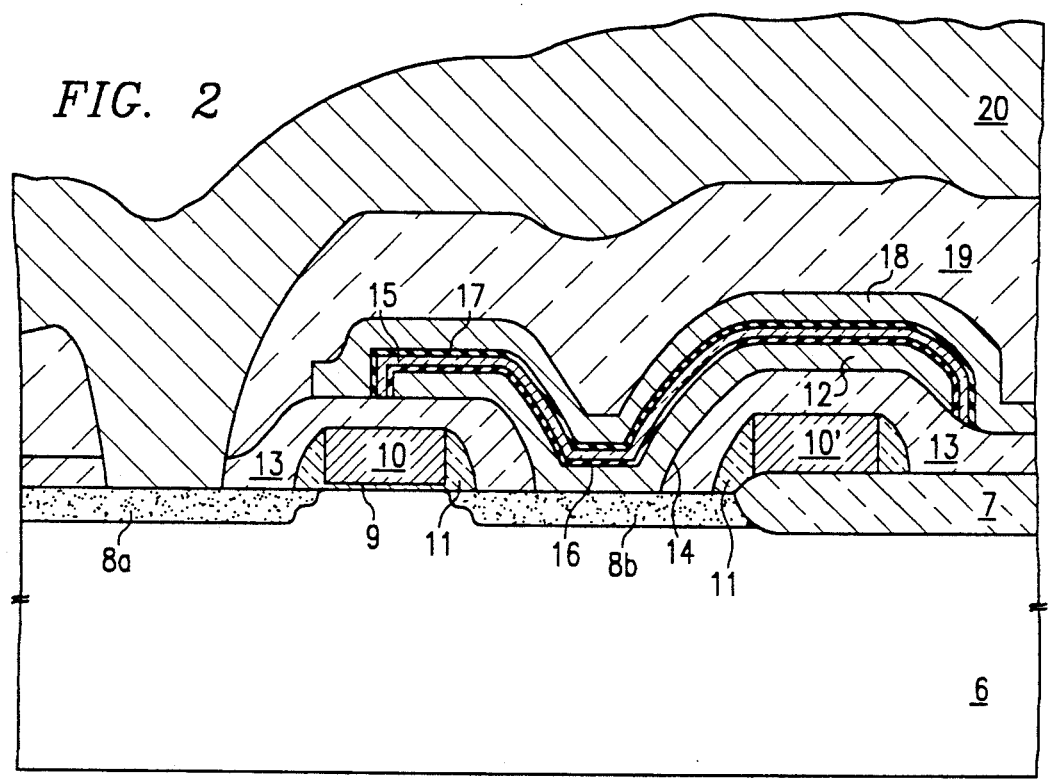
FIG. 2 is a cross-sectional diagram of a memory cell formed according to the present invention.
Figure 3:
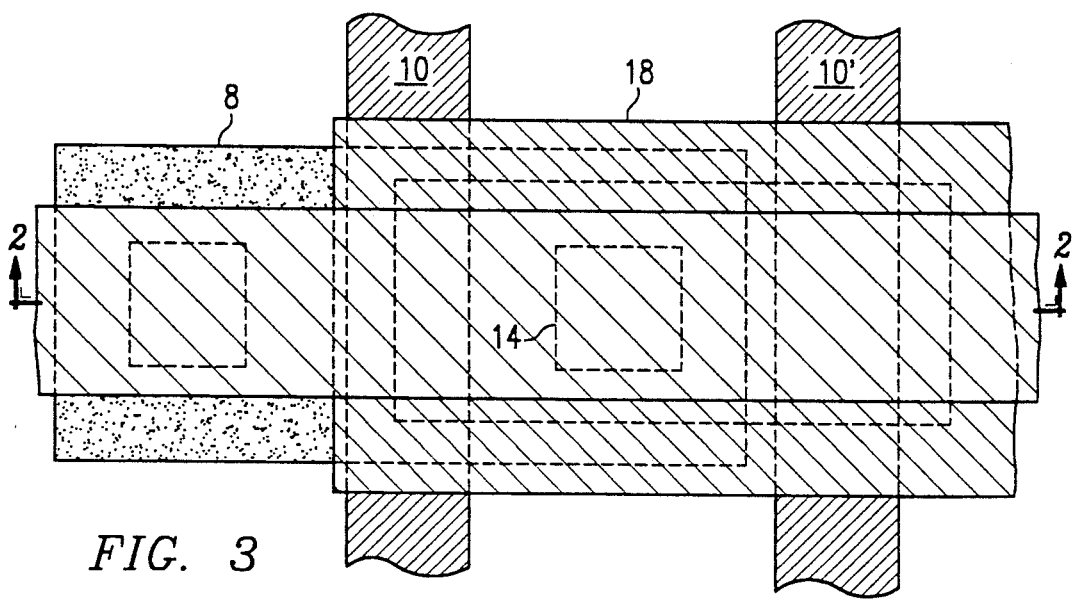
FIG. 3 is a plan view of the memory cell of FIG. 2.

Referring now to FIGS. 2 and 3 in combination, the physical construction of an example of a DRAM cell incorporating capacitor 2 according to the present invention will now be described in detail. The configuration to be described in detail herein is commonly referred to as a "stacked capacitor" DRAM cell. It should be understood, however, that the present invention is also applicable to DRAM cells of other types, including those where the lower capacitor plate is in bulk silicon, and also including planar and trench capacitor configurations (including the placement of a stacked capacitor in a trench). In addition, the present invention may also be used in the formation of integrated circuit capacitors other than those in DRAM cells, as well as in the formation of other dielectric films such as gate dielectrics for MOS transistors and the like.

As shown in FIG. 2, this example of a DRAM cell is formed at a surface of p-type single-crystal <100> silicon substrate 6. Substrate 6 may be bulk silicon, or alternatively may be an epitaxial layer formed over a silicon or insulating substrate. Furthermore, as is well known in the art for CMOS DRAMs, substrate 6 may be a doped tub or well, either in bulk or in an epitaxial layer; further in the alternative, substrate 6 may be n-type (into which are formed p-type transistors).

Formed into a portion of substrate 6 are n-type source/drain regions 8a, 8b of pass transistor 4. Source/drain region 8b is preferably heavily doped, as it is in contact with bit line BL as will be noted hereinbelow; depending on the particular implementation, source/drain region 8a may be as heavily doped as source/drain region 8b, or alternatively it may be significantly more lightly doped. Gate electrode 10 is formed of polysilicon, metal silicide, or a combination of the two as is well known, and overlies a channel region between source/drain regions 8a, 8b. Besides serving as the gate electrode of pass transistor 4, gate electrode 10 also conducts the row selection signal and thus serves as word line WL (see FIG. 3). In this example, pass transistor 4 is formed according to the well-known lightly-doped-drain (LDD) configuration, where gate electrode 10 has sidewall insulating spacers 11 along its sides which define relatively lightly-doped extensions of source/drain regions 8a, 8b thereunder. This construction reduces hot electron effects and other undesirable conditions in short-channel MOS transistors as is well known.

Gate electrode 10' is of similar construction as gate electrode 10, and overlies field isolation oxide 7 adjacent source/drain region 8b. Gate electrode 10' serves as the word line for a row of DRAM cells adjacent to the row in which capacitor 2 of FIG. 2 is assigned, and thus has no functional effect on the DRAM cell illustrated. For purposes of layout efficiency, however, gate electrode 10' runs parallel to gate electrode 10 (see FIG. 3), and indeed is physically located within the boundaries of its neighboring DRAM cell.

Interlevel dielectric layer 13 overlies gate electrodes 10, 10', and preferably consists of deposited silicon dioxide of sufficient thickness as to provide electrical isolation between gate electrodes 10, 10' and other conductive cell elements. First capacitor plate 12 overlies interlevel dielectric 13, making contact through contact opening 14 therethrough to source/drain region 8b. In this embodiment of the invention, first capacitor plate 12 is formed of n-type doped polycrystalline silicon. For purposes of maximizing the layout efficiency, first capacitor plate 12 also overlies neighboring gate electrode 10'.

Overlying first capacitor plate 12 is a capacitor dielectric formed according to the present invention, which in this example includes silicon nitride layer 16, silicon dioxide layer 15, and an optional sealing (oxide or nitride) layer 17. Overlying capacitor dielectric 15, 16, 17 is second capacitor plate 18, which may be formed of polycrystalline silicon, refractory metal, a metal silicide, or a non-refractory metal such as aluminum. Second capacitor plate 18 is connected (in a manner not shown) to a fixed voltage such as ground, a power supply, or a regulated reference voltage, depending upon the circuit configuration.

Second interlevel dielectric 19 overlies second capacitor plate 18, with bit line 20 formed thereover, and also preferably consists of deposited oxide of sufficient thickness to provide electrical isolation therebetween. A contact opening is present through interlevel dielectric 19, through which bit line 20 makes contact to source/drain region 8a. As is shown in FIG. 3, bit line 20 runs perpendicularly to gate electrodes 10, 10', in the conventional manner for DRAM memory arrays. Bit line 20 is preferably formed of a high conductivity material, such as aluminum, a refractory metal or metal silicide; alternatively, a doped region of bulk silicon or doped polysilicon (either of which may be clad with a metal silicide or other higher conductivity material) may be used as bit line 20.

As is evident particularly from the plan view of FIG. 3, and as is fundamental in the art, the efficient use of chip area in the layout of the DRAM cell is of great concern. For example, conventional manufacturing techniques are capable of forming feature sizes on the order of one micron or less for polysilicon lines such as gate electrodes 10, 10'. The size of storage capacitor 2 in this example may thus be on the order of 10 micron$^2$ (considering the increased surface area from the topography of plates 12, 18). For a reliable DRAM capacitor of this size, having on the order of 50 fF capacitance, if the capacitor dielectric were to be formed purely of silicon dioxide, its thickness would have to be on the order of 7 nm. Silicon dioxide films which are this thin are quite susceptible to pinhole defects, particulate contaminants and other defects which have a devastating impact on manufacturing yield, particularly for DRAMs of high density such as 4 MBit and larger.

According to this embodiment of the invention, a method will be described by which a composite capacitor dielectric film can be fabricated, thus providing a larger effective dielectric constant and thus higher capacitance per unit area, while also providing a thicker film which is less vulnerable to point defects and to interfacial contamination. This method will now be described relative to FIGS. 4a through 4g.

Figure 4A:
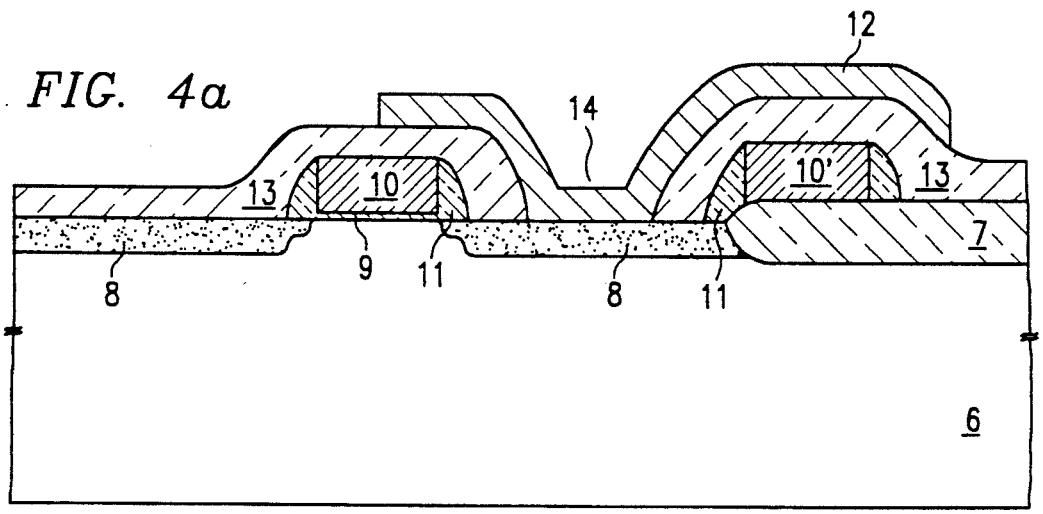
FIGS. 4a through 4g are cross-sectional diagrams illustrating various steps in the formation of the memory cell of FIG. 2.
Figure 4B:
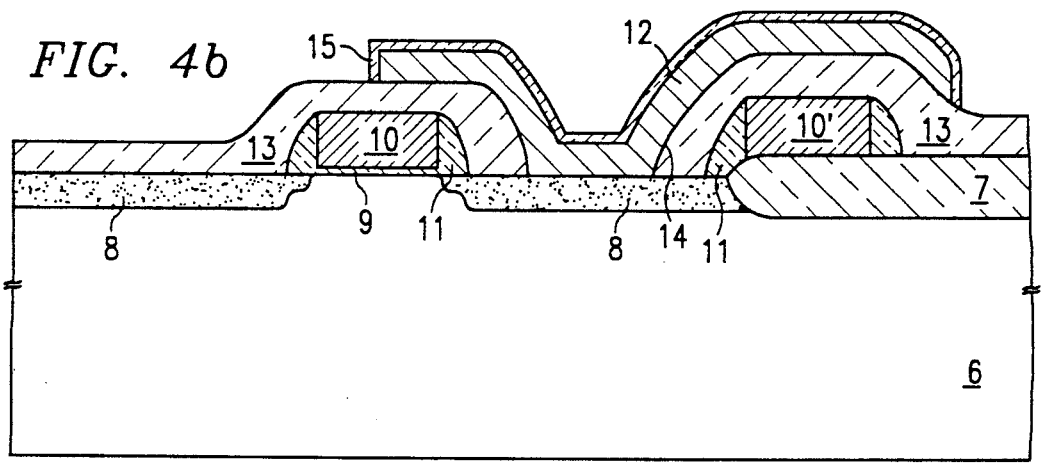

This description of a method according to the preferred embodiment begins, in this example, with the structure in the state illustrated in FIG. 4a. At this point in the process, pass transistor 4 has been constructed, including source/drain regions 8a, 8b formed in self-aligned fashion relative to gate electrode 10; gate electrode 10', formed of the same polysilicon layer as gate electrode 10, is of course also present at this time. Also at this stage of the process, interlevel dielectric layer 13 is in place over gate electrodes 10, 10', with contact opening 14 having been etched therethrough. First capacitor plate 12 overlies interlevel dielectric layer 13 and is in contact with source/drain region 8b through contact opening 14.

According to this embodiment of the present invention, first capacitor plate 12 is formed of silicon, for example polycrystalline silicon, having a thickness on the order of 50 to 200 nm. First capacitor plate 12 is also preferably doped so as to be relatively conductive, and is patterned and etched in the conventional manner according to the desired shape and size thereof. Interlevel dielectric 13 is TEOS oxide of a thickness on the order of 200 nm.

After formation of first capacitor plate 12, a conventional cleanup of the surface is performed, for example an acid-based cleanup to remove heavy metals together with such other conventional cleanup processes as necessary to remove surface contaminants from the surface of plate 12. Thin silicon dioxide layer 15 is then formed thereover, preferably formed by thermal oxidation of first capacitor plate 12 because of the relatively high integrity of thermal oxide films, especially useful in DRAM cell capacitors; alternatively, silicon dioxide layer 15 may be deposited by way of chemical vapor deposition. An example of the conditions for thermal oxidation of silicon is dry oxidation, in a dilute (10:1) oxidizing atmosphere, for one-half hour at a temperature of 900° C., resulting in oxide layer 15 of a thickness on the order of 5 nm thick over heavily doped polysilicon first plate 12. Dry oxidation in a dilute atmosphere is preferred in the formation of very thin oxide layer 15, because the slow oxidation rate under these conditions facilitates control of the film thickness. It is contemplated that the thermal oxidation of first capacitor plate 12 will not substantially oxidize other silicon features underlying interlevel dielectric 13, such as source/drain regions 8a, 8b and gate electrodes 10, 10'.

Figure 4C:
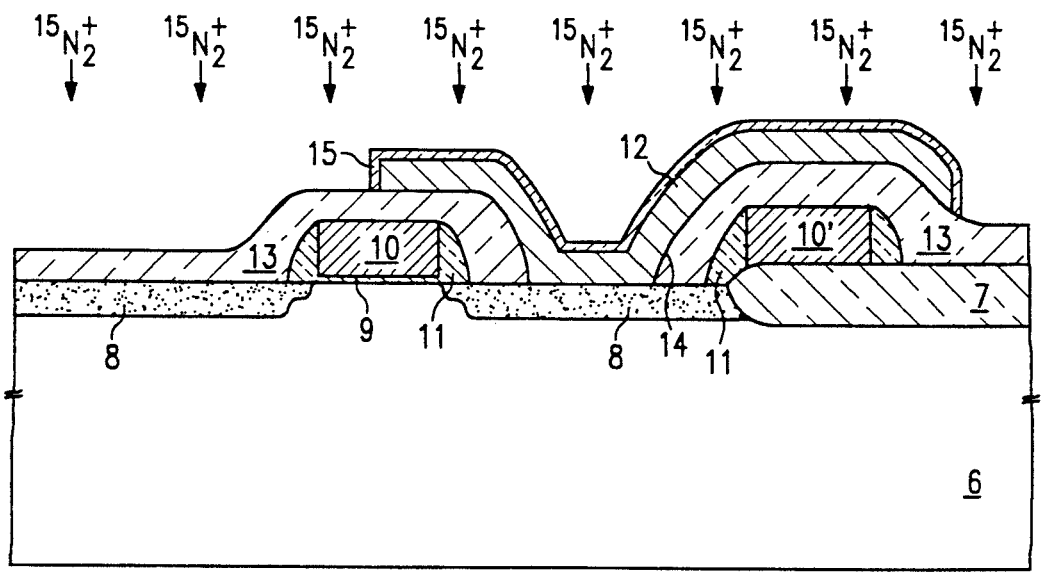

According to this embodiment of the invention, oxidized first capacitor plate 12 is then implanted with nitrogen ions, as illustrated in FIG. 4c. Similarly as described in the Josquin et al. article cited hereinabove, the preferred implanted species is $^{15}N_2^+$ at a dose in the range of 1E14 to 1E16 ions/cm$^2$. In the example shown, since it is desirable to also form a nitride layer on the sidewalls of first capacitor plate 12, the energy of this implantation is selected so that the peak distribution after implant is near the center of first capacitor plate 12. For oxide layer 15 having a thickness on the order of 5 nm, and for first polysilicon plate 12 having a thickness approximately 100 nm, the preferred energy for this implant will be approximately 25 keV.

Figure 4D:
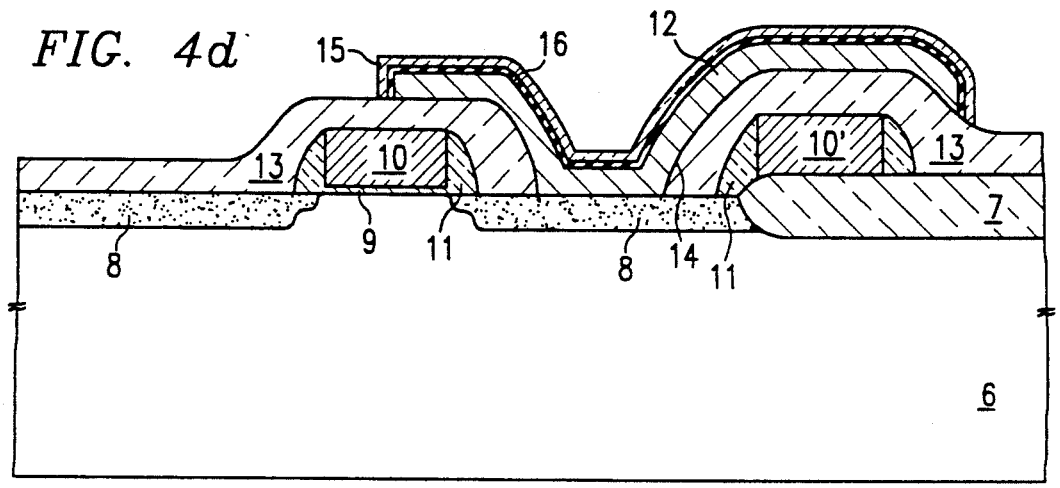

Also as described in the Josquin et al. article cited hereinabove, the anneal of nitrogen-implanted silicon underlying an oxide layer causes the implanted nitrogen to accumulate at the silicon/oxide interface, forming a nitride-layer thereat. According to the preferred embodiment of the present invention, this mechanism is used to advantage in forming silicon nitride (or nitride-like) layer 16 between oxide layer 15 and first capacitor plate 12, resulting in a nitride/oxide composite dielectric over first capacitor plate 12 as shown in FIG. 4d. A preferred anneal is at a temperature on the order of 900° C., in a nitrogen atmosphere, for on the order of one hour, which will form a nitride layer 16 having a thickness believed to be on the order of 1.5 to 2.0 nm (direct measurement of this film being quite difficult).

The composite dielectric film of nitride layer 16 and oxide layer 15, as shown in FIG. 4d, may be used as a high dielectric constant capacitor dielectric for a DRAM cell and for other integrated circuit capacitors. For example, the combination of nitride layer 16 of a thickness on the order of 1.5 nm and oxide layer 15 of a thickness on the order of 5 nm will provides the dielectric equivalent of approximately 7 nm of pure silicon dioxide. The present invention thus allows for formation of this composite layer without exposing the interface between nitride layer 16 and oxide layer 15, such exposure possibly contaminating this interface and resulting in interfacial charge trapping sites, which would adversely affect the capacitor threshold voltage and its stability.

It is contemplated that the structure of nitride layer 16 formed according to this embodiment of the invention by the accumulation and reaction of implanted nitrogen at the silicon/oxide interface will appear different from a nitride layer formed by CVD or direct thermal nitridation of silicon, when examined by high resolution analysis equipment such as a scanning electron microscope (SEM), Auger spectroscopy and the like. This is because, as noted in the Josquin et al. article, the stoichiometry of nitride layer 16 may not be exactly $Si_3N_4$, as in the case of CVD nitride for example, and it may not consist of purely silicon nitride but may instead be a mixture of silicon, silicon nitride, and silicon oxides. In particular, as viewed via transmission electron microscopy (TEM), it is expected that nitride layer 16 will have a relatively soft interface to the underlying polysilicon and a relatively sharply defined interface with the overlying oxide layer 15, in contrast to a deposited or thermal nitride film which would have sharply defined interfaces with both the underlying polysilicon and the overlying oxide.

As noted hereinabove, sealing oxidation of a nitride layer in a nitride/oxide or oxide/nitride/oxide composite capacitor dielectric is conventionally performed, as it is believed that such additional oxidation will oxidize silicon exposed by defects or pinholes in the nitride film, as well as a portion of the nitride film itself. While the nitride/oxide composite film of FIG. 4d according to this embodiment of the invention may be used for a capacitor dielectric itself, such additional thermal processing may be preferable to further "seal" defects in this composite film.

Figure 4E:
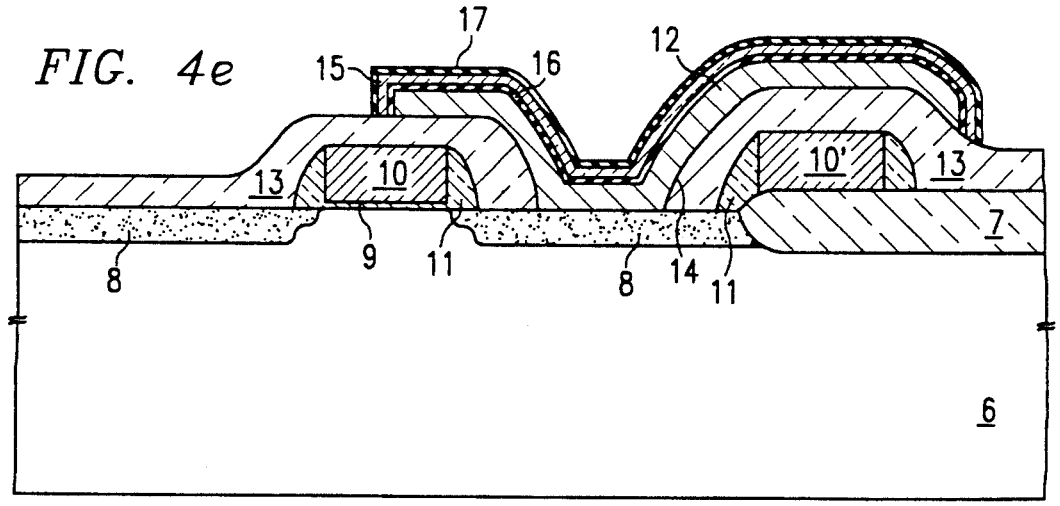

According to this embodiment of the invention, an additional thermal oxidation is preferred to eliminate the effects of pinholes or other defects in oxide layer 15 and nitride layer 16 thereunder. The conditions of this additional oxidation are as conventional in the art for sealing oxidation of conventional oxide/nitride films. As a result of this additional oxidation, additional sealing layer 17 formed of silicon dioxide will be formed over oxide layer 15, as shown in FIG. 4e.

Alternatively, the sealing thermal reaction may be thermal nitridation of oxide layer 15, forming a nitride layer thereover, resulting in a nitride/oxide/nitride film.

As in other composite films, the increased thickness of the composite layer formed according to the present embodiment of the invention, as well as its multiple layer construction (including nitride layer 16 and oxide layer 15), particularly when followed by a sealing thermal reaction, provides reduced susceptibility of failure due to pinholes and other point defects as compared to silicon dioxide. In addition, since the composite film according to the present invention is formed without exposure of the surface of the nitride layer, the likelihood of contamination of the first nitride/oxide interface is eliminated. In addition, the nitrogen implant and short nitridation anneal forms the nitride layer in less time than direct nitridation or CVD of silicon nitride, providing additional processing efficiency.

Furthermore, the sealing reaction (oxidation or nitridation) may be performed in the same processing chamber as the anneal for forming nitride layer 16. In the case of nitridation, the sealing reaction may be performed by continuing the anneal by which nitride layer 16 is formed, preventing additional exposure of the interface between oxide layer 15 and sealing layer 17, further reducing the possibility for interfacial contamination and improving the processing efficiency of this structure.

Figure 4F:
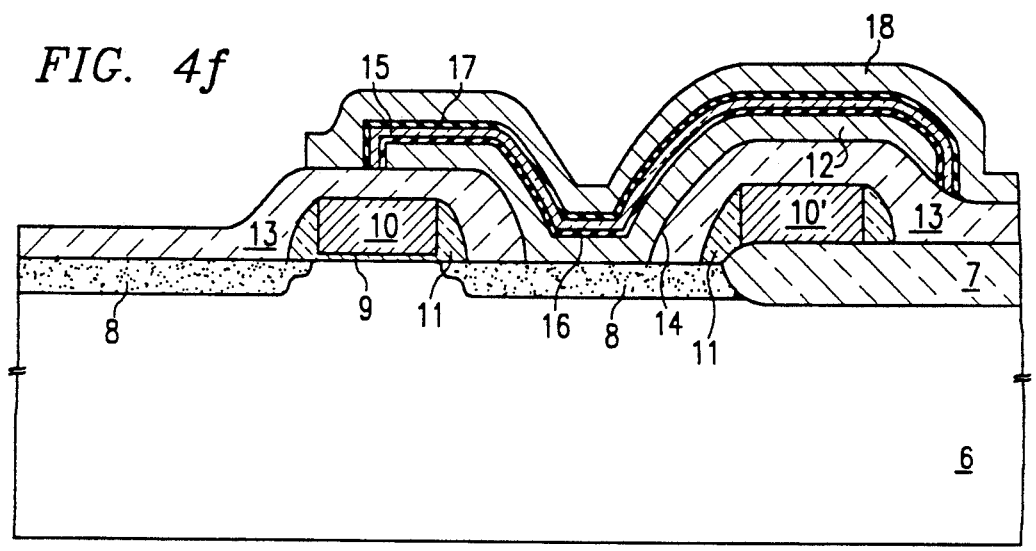

Following the formation of sealing layer 17, second capacitor plate 18 is deposited, patterned and etched in the conventional manner so as to cover first capacitor plate 12 and composite dielectric film 15, 16, 17; second capacitor plate 18 also extends away (not shown) from the DRAM cell for connection to a power supply node, to ground, or to a reference voltage level. Second capacitor plate 18 may be formed of doped polysilicon, similarly as first capacitor plate 12, or alternatively may be formed of a refractory metal, a refractory metal silicide, or, if the remaining processing may be done at a relatively low temperature, of aluminum or doped aluminum. A typical thickness for second capacitor plate 18 is on the order of 100 nm for polysilicon. The resulting structure is illustrated in FIG. 4f.

Figure 4G:
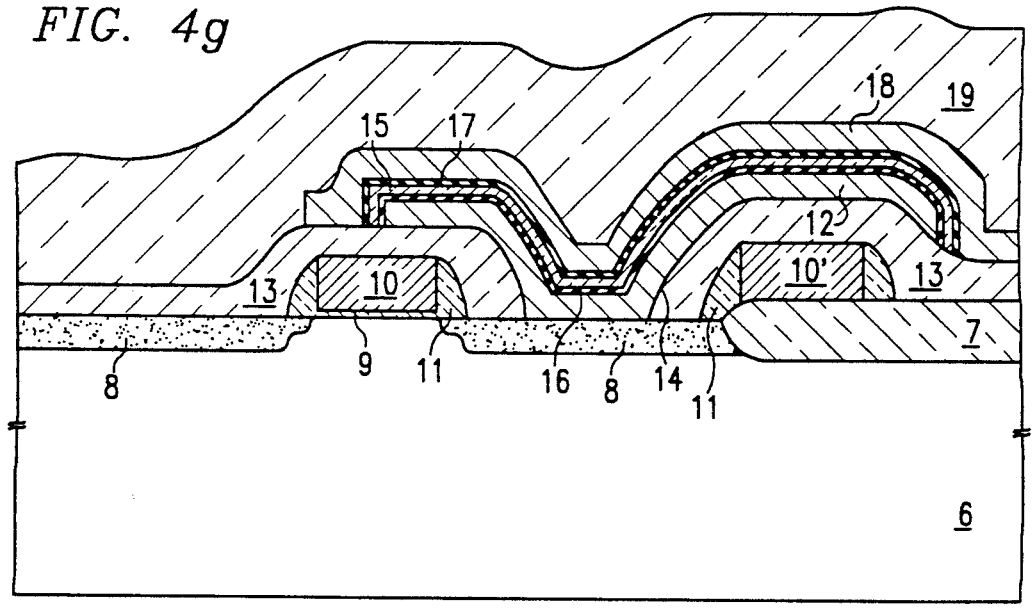

Second interlevel dielectric 19 is then formed overall as shown in FIG. 4g, so that eventual overlying conductors may be insulated from the capacitor and transistor formed at this point. Second interlevel dielectric 19 is preferably a deposited silicon dioxide, having a thickness sufficient to reduce the extent to which noise generated on the bit lines capacitively couples to the underlying elements, for example on the order of 500 nm. After the opening of a contact opening through second dielectric layer 19, bit line 20 of a highly conductive material such as a metal or metal silicide is sputtered or otherwise deposited thereover to a thickness on the order of 600 nm, and is patterned and etched to form bit line 20 in a direction extending in a substantially perpendicular direction relative to gate electrodes 10, 10'. The completed DRAM cell is illustrated as described hereinabove relative to FIGS. 2 and 3.

As noted hereinabove, the present invention is particularly useful in producing a capacitor, such as used in a DRAM cell. Of course, while the invention has been described herein relative to its preferred embodiment (for example, a planar stacked capacitor DRAM cell), the invention may alternatively be used in a stacked or trench type DRAM cell, or in a capacitor in a logic circuit or other integrated circuit. In each case, the present invention provides the ability to manufacture such composite dielectric films without exposure of the interfaces therebetween to the ambient or other contaminant bearing atmosphere that is outside of the processing equipment.

It is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of fabricating a capacitor in an integrated circuit, comprising:
    forming a first capacitor plate comprising silicon at a semiconducting surface of a body;
    forming a first dielectric layer comprising silicon dioxide over a surface of said first capacitor plate;
    implanting nitrogen through said first dielectric layer and into said first capacitor plate;
    heating said body under time and temperature conditions so that at least some of the implanted nitrogen accumulates at the interface between said first capacitor plate and said first dielectric layer; and
    forming a second capacitor plate over said first capacitor plate in such a manner that said first dielectric layer is disposed therebetween.

2. The method of claim 1, further comprising:
    after said heating step, heating said body in a reactive atmosphere to reduce the effects of defects in said first dielectric layer.

3. The method of claim 2, wherein said reactive atmosphere comprises oxygen.

4. The method of claim 3, wherein said reactive atmosphere comprises nitrogen.

5. The method of claim 1, wherein said step of forming a first dielectric layer comprises thermally oxidizing a portion of said first capacitor plate.

6. The method of claim 1, wherein said first capacitor plate comprises a portion of said semiconducting surface of said body.

7. The method of claim 1, further comprising:
    forming a first interlevel dielectric layer;
    wherein said step of forming said first capacitor plate is performed after said step of forming a first interlevel dielectric layer.

8. The method of claim 1, further comprising:
    forming a pass transistor at said surface of said body, said pass transistor having a conduction path and a control electrode.

9. The method of claim 8, wherein said step of forming said first capacitor plate forms said first capacitor plate in contact with the conduction path of said pass transistor.

10. The method of claim 9, further comprising:
    forming a first interlevel dielectric over the conduction path of said pass transistor;
    etching a contact opening through said first dielectric and in contact with the conduction path of said pass transistor;
    and wherein said step of forming said first capacitor plate is performed after said etching step, so that said first capacitor plate is formed in contact with the conduction path of said pass transistor through said contact opening.

11. A capacitor formed by a method comprising:
    forming a first capacitor plate comprising silicon at a semiconducting surface of a body;
    forming a first dielectric layer comprising silicon dioxide over a surface of said first capacitor plate;
    implanting nitrogen through said first dielectric layer and into said first capacitor plate;
    heating said body under time and temperature conditions so that at least some of the implanted nitrogen accumulates at the interface between said first capacitor plate and said first dielectric layer; and
    forming a second capacitor plate over said first capacitor plate in such a manner that said first dielectric layer is disposed therebetween.

12. The capacitor of claim 11, wherein the method further comprises:
    after said heating step, heating said body in a reactive atmosphere to reduce the effects of defects in said first dielectric layer.

13. The capacitor of claim 12, wherein said reactive atmosphere comprises oxygen.

14. The capacitor of claim 13, wherein said reactive atmosphere comprises nitrogen.

15. The capacitor of claim 11, wherein said step of forming a first dielectric layer comprises thermally oxidizing a portion of said first capacitor plate.

16. A dynamic random access memory cell formed by a method comprising:
    forming a pass transistor having a conduction path and a control electrode at a semiconducting surface of a body;
    forming a first capacitor plate comprising silicon at said surface, said first capacitor plate in contact with the conduction path of said pass transistor;
    forming a first dielectric layer comprising silicon dioxide over a surface of said first capacitor plate;
    implanting nitrogen through said first dielectric layer and into said first capacitor plate;
    heating said body under time and temperature conditions so that at least some of the implanted nitrogen accumulates at the interface between said first capacitor plate and said first dielectric layer; and
    forming a second capacitor plate over said first capacitor plate in such a manner that said first dielectric layer is disposed therebetween.

17. The memory cell of claim 16, wherein said method further comprises:

forming a first interlevel dielectric over the conduction path of said pass transistor;

etching a contact opening through said first dielectric and in contact with the conduction path of said pass transistor;

and wherein said step of forming said first capacitor plate is performed after said etching step, so that said first capacitor plate is formed in contact with the conduction path of said pass transistor through said contact opening.

* * * * *